(12) United States Patent
Bauer et al.

(10) Patent No.: US 7,482,198 B2
(45) Date of Patent: Jan. 27, 2009

(54) METHOD FOR PRODUCING THROUGH-CONTACTS AND A SEMICONDUCTOR COMPONENT WITH THROUGH-CONTACTS

(75) Inventors: Michael Bauer, Nittendorf (DE); Edward Fuergut, Dasing (DE); Simon Jerebic, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 114 days.

(21) Appl. No.: 11/586,740

(22) Filed: Oct. 26, 2006

(65) Prior Publication Data

US 2007/0099345 A1 May 3, 2007

Related U.S. Application Data

(63) Continuation of application No. PCT/DE2005/000754, filed on Apr. 25, 2005.

(30) Foreign Application Priority Data

Apr. 26, 2004 (DE) .................. 10 2004 020 497

(51) Int. Cl.
*H01L 21/44* (2006.01)
*H01L 21/48* (2006.01)
*H01L 21/50* (2006.01)

(52) U.S. Cl. .............. 438/106; 438/289; 257/E21.499; 257/E21.585

(58) Field of Classification Search ................ 438/106, 438/174, 289, 637
See application file for complete search history.

(56) References Cited

U.S. PATENT DOCUMENTS

| 4,694,138 | A | | 9/1987 | Oodaira et al. | |
|---|---|---|---|---|---|
| 5,476,714 | A | * | 12/1995 | Hyatt | .......................... 428/402 |
| 5,813,881 | A | | 9/1998 | Nathan et al. | |
| 5,906,042 | A | | 5/1999 | Lan et al. | |
| 5,906,043 | A | | 5/1999 | Lan et al. | |
| 6,190,509 | B1 | * | 2/2001 | Haba | ........................... 204/164 |
| 2003/0030143 | A1 | | 2/2003 | Wennemuth et al. | |
| 2003/0057544 | A1 | | 3/2003 | Nathan et al. | |
| 2003/0141105 | A1 | | 7/2003 | Sugaya et al. | |

FOREIGN PATENT DOCUMENTS

| DE | 2902002 A1 | 7/1980 |
|---|---|---|
| DE | 19715898 A1 | 10/1998 |
| DE | 10153609 A1 | 5/2003 |
| EP | 0611129 B1 | 6/2002 |
| JP | 08061331 | 3/1996 |

* cited by examiner

*Primary Examiner*—David Nhu
(74) *Attorney, Agent, or Firm*—Edell, Shapiro & Finnan, LLC

(57) ABSTRACT

A method is described for producing through-contacts through a panel-shaped composite body including semiconductor chips and a plastic mass filled with conductive particles. The panel-shaped composite body is introduced between two high-voltage point electrodes. The point electrodes are oriented at positions at which through-contacts are to be introduced through the plastic mass. A high voltage is applied to the point electrodes thereby, forming the through-contacts through the plastic mass.

9 Claims, 4 Drawing Sheets

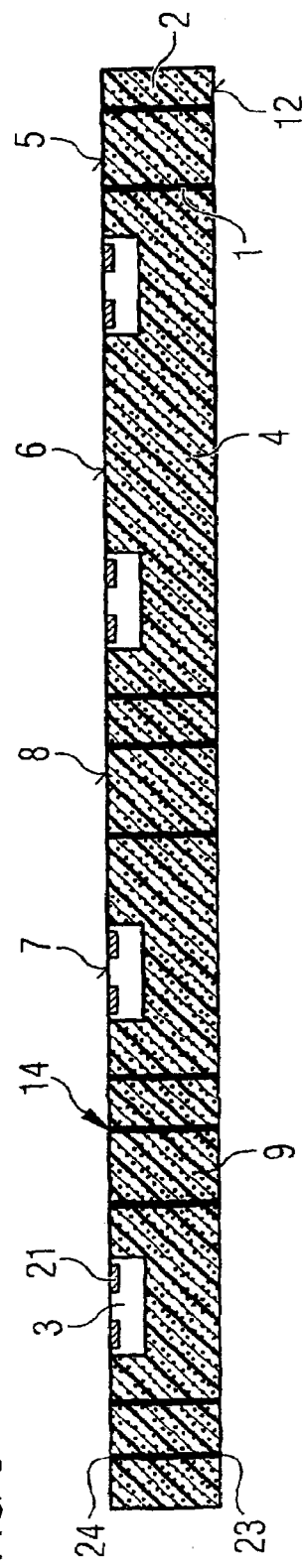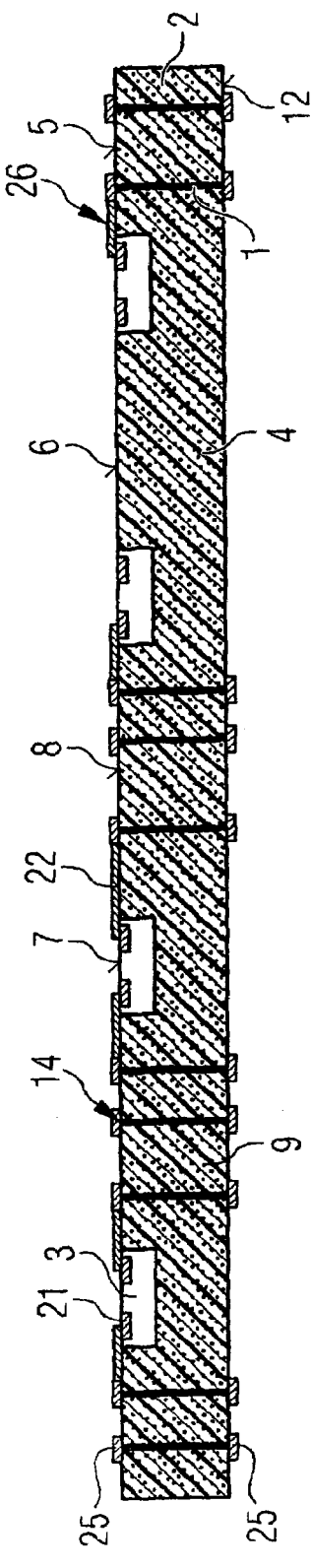

METHOD FOR PRODUCING THROUGH-CONTACTS AND A SEMICONDUCTOR COMPONENT WITH THROUGH-CONTACTS

CROSS REFERENCE TO RELATED APPLICATIONS

This application is a continuation of International Application No. PCT/DE 2005/000754, filed on Apr. 25, 2005, entitled "Method for Producing Through Contacts and a Semiconductor Component with Such Through-Contacts," which claims priority under 35 U.S.C. §119 to Application No. DE 102004020497.7 filed on Apr. 26, 2004, entitled "Method for Producing Through Contacts and a Semiconductor Component with Such Through-Contacts," the entire contents of which are hereby incorporated by reference.

BACKGROUND

Previous techniques for implementing such through-contacts in semiconductor components so that external contacts which are electrically connected to one another are present both on the upper side of the semiconductor component and on the underside of the semiconductor component are technically complex and not very reliable if these through-contacts are to be led through a plastic mass. For this reason, other known solutions, provide complex and flexible wiring foils which are arranged between the components and form electrical contact between the upper side of a semiconductor component and external contacts on the underside of the semiconductor component via bent regions. This known technology is problematic if the semiconductor components have extremely thin plastic masses, in order to save space and material, and bending the wiring foils thus leads to malfunctions due to microtears.

No usable solutions at all are known for the situation in which the semiconductor components are accommodated in what is referred to as a wafer level package. This technology is based on a panel-shaped composite body which is made of plastic mass and semiconductor chips and has a coplanar face for the application of a rewiring layer, which coplanar face comprises at least one active upper side of a semiconductor chip and surfaces of the surrounding plastic mass. The panel-shaped composite body can have the dimensions of a disk-shaped semiconductor wafer or the dimensions of a printed circuit board such as that for a use in which the semiconductor components are arranged in rows and columns. The problems which are associated with the formation of through-contacts in such a wafer or such a use, such as reliability of the through-contact, reduction of costs and technical feasibility, have not been solved up to now.

SUMMARY

The described device relates to a method for producing through-contacts and a semiconductor component with such through-contacts. Furthermore, the described device relates to horizontally and vertically stacked semiconductor modules with such through-contacts. In a horizontally stacked semiconductor module, the semiconductor components of the module are arranged one next to the other and in the case of a vertically stacked semiconductor module the semiconductor components are stacked one on top of the other. In the former case the semiconductor components are coupled electrically to a semiconductor module via a rewiring layer. In the latter case, the semiconductor components of the stack are coupled horizontally via rewiring layers and are electrically connected to one another in the vertical direction via the through-contacts.

A method is described below for producing through-contacts through a panel-shaped composite body including semiconductor chips and a plastic mass filled with conductive particles. The panel-shaped composite body is introduced between two high-voltage point electrodes; the point electrodes are oriented at positions at which through-contacts are to be introduced through the plastic mass. A high voltage is applied to the point electrodes thereby, forming the through-contacts through the plastic mass.

The above and still further features and advantages of the described device and method will become apparent upon consideration of the following definitions, descriptions and descriptive figures of specific embodiments thereof, wherein like reference numerals in the various figures are utilized to designate like components. While these descriptions go into specific details of the device and method, it should be understood that variations may and do exist and would be apparent to those skilled in the art based on the descriptions herein.

BRIEF DESCRIPTION OF THE DRAWINGS

The device is explained in more detail below with reference to exemplary embodiments, where:

FIGS. 3-6 are schematic cross sections through intermediate products of individual processes of a method for the manufacture of a composite panel with through-contacts according to a third embodiment of the described device;

FIG. 3 is a schematic cross section through a composite panel without through-contacts;

FIG. 4 is a schematic cross section through the composite panel according to FIG. 3 with fitted-on multipoint electrodes;

FIG. 5 is a schematic cross section through the composite panel according to FIG. 4 after the through-contacts have been fabricated;

FIG. 6 is a schematic cross section through the composite panel according to FIG. 5 after the application of external contact faces and a wiring layer.

DETAILED DESCRIPTION

Figure 1:
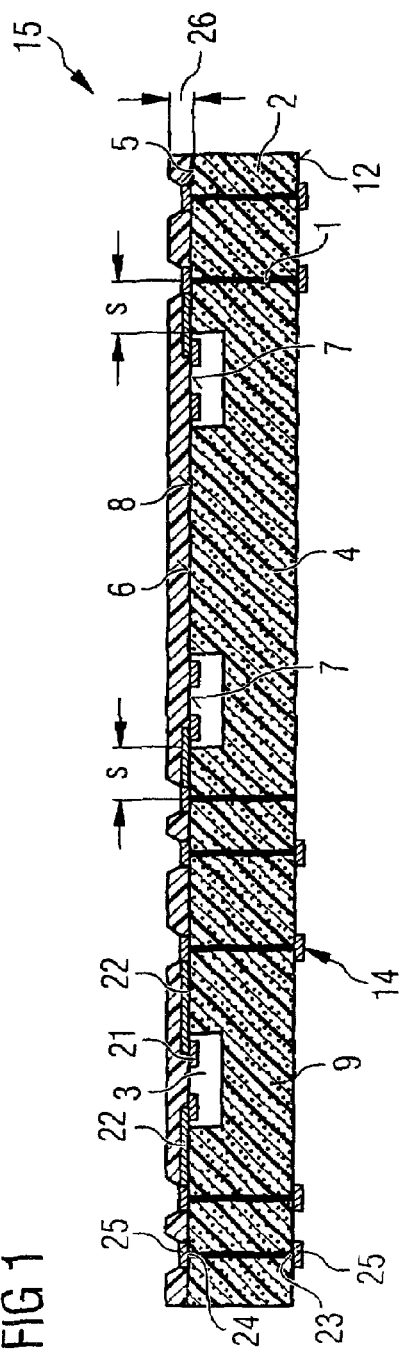
FIG. 1 is a schematic cross section through a semiconductor module according to a first embodiment of the described device.

A method is described herein for manufacturing through-contacts and a semiconductor component with such manufactured through-contacts. This method is economical, increases reliability of the through-contacts and can be implemented in the smallest possible space.

The method relates to producing through-contacts through a panel-shaped composite body including semiconductor chips and a plastic mass. First, a panel-shaped composite body is produced. The upper side of the panel-shaped composite body includes a coplanar face with active upper sides of semiconductor chips and surfaces of an insulating plastic mass filled with conductive particles. Despite these conductive particles filling the plastic mass, the mass remains completely insulating at first. This composite body is subsequently introduced between two high-voltage point electrodes. The point electrodes are oriented on the upper side and the underside of the composite body in the region of the plastic mass such that the points of the point electrodes are opposite one another at the positions at which through-contacts are produced through the plastic mass which is filled with conductive particles. After the orientation process, a high voltage is applied to the point electrodes. The high voltage is subsequently switched off and the through-contacted panel-shaped composite body is removed from the point electrodes.

This method has the advantage that through-contacts are produced simultaneously at all positions which are to have through-contacts since under the high voltage the conductive particles produce a short circuit via which an energy stream flows which either fuses or sinters the conductive particles to one another. In this context, the plastic present between the particles is simultaneously converted into conductive carbon bridges. This method is particularly effective if the composite body is to be made extremely thin by virtue of the fact that the thickness of the composite body corresponds to the thickness of semiconductor wafers or of printed circuit boards.

In forming such through-contacts via the described method, there is no need for the laborious process of: forming through-holes through the plastic, depositing conductive material in through-openings, masking the composite body and likewise avoiding expensive photolithographic techniques.

The method for introducing the through-contacts via applying the high voltage contrasts known methods, e.g., a burning-in technique, since the high voltage method does not depend on, inter alia, combustion processes. As compared to known methods which require combustion and burn-in, the described method is somewhat analogous, in regards to concept, to methods of spot welding, e.g., known from general technology in the automobile industry. However, spot welding also differs from the described method especially since in the described method an insulating plastic mass is subjected to high voltage thereby changing the conductive properties of the mass in the areas of the applied voltage. By contrast, methods of spot welding subject solid metal plates to high voltages in order to mechanically connect the plates. The diameter of the through-contacts in the method according to the described device is in the range of submicrometer dimensions up to dimensions in the range of several tens of micrometers or μm. In the described method, the through-contacting pillar is not formed uniformly, with a smooth lateral surface but rather is oriented according to the most favorable flow of energy from one point electrode to the other point electrode through the plastic which is filled with conductive particles. As a result, the through-contacts do not have any smooth pillar lateral surfaces as an external contour but rather exhibit a frayed cross section which is, however, located at the positions predefined by the oriented points of the electrodes on both sides of the composite body.

In one preferred embodiment, the two point electrodes are oriented in such a way that they are at a safety distance from the active upper sides of the semiconductor chips which are embedded in the plastic mass. This safety distance is necessary to prevent the semiconductor material from being included in the current path of the through-contacts which are being formed. The safety distance depends on the high voltage with which the point electrodes are operated and is between 0.2 and 5 mm.

The semiconductor chips are arranged in rows and columns in the plastic mass and the through-contacts are formed through the plastic around the semiconductor chips. The edge sides and the rear side of the semiconductor chips are surrounded by plastic mass, while the active upper side includes a face which is coplanar with the surfaces of the plastic mass.

In one preferred embodiment, a plurality of point electrodes are arranged on one common electrode surface of a multiple point electrode. The size of the multiple point electrode corresponds in this embodiment to the size of the composite body. It is thus advantageously possible, with a single orientation step, to orient the points of two multiple point electrodes with positions of through-contacts to be formed on the upper side and underside of the composite body. When through-contacts are formed, a multiplicity of through-contacts is also implemented between the upper side and underside of the composite body with a single through-contacting step. This results in a multiplicity of through-contacts at predetermined positions of a panel-shaped composite body such as a disk or a panel.

In order to form the through-contacts, a high voltage between 1 and 10 kV is applied to the point electrode. For the metallic particles located in the high-voltage field, such a low high voltage is sufficient to form an electrical path through the plastic of the composite panel. Furthermore, the high voltage can also be applied in the form of pulse sequences to the point electrodes. In this case, high voltages which are higher by an order of magnitude are applied to the point electrodes in pulses, the high voltage being adjusted to zero in the pulse intervals.

The plastic mass is preferably filled with conductive particles in the range from 80 to 98% by weight with residual insulating plastic mass. The degree of filling depends partially on the specific weight of the conductive particles and is to be made higher if the specific weight of the conductive particles is high compared to the specific weight of the plastic mass. Furthermore, nanoparticles which agglomerate in such a plastic mass to form heaps of nanoparticles and thus permit through-contacting via nanoparticle agglomerates are preferably used as metallic particles.

Another possible way of filling the plastic with conductive particles is to use conductive silver and/or copper particles in the range from 80 to 98% by weight with residual insulating plastic mass for the degree of filling. Here it is ensured that when the filling level is defined the plastic mass initially continues to have an insulating effect and through-contacts are formed only through the treatment with a high voltage. In particular in the case of metallic particles it has proven appropriate to add a reducing medium of the plastic mass. This reduces, for example, the risk of oxidation of the copper when forming the through-contacts.

With a further aspect, a semiconductor component is provided with a semiconductor chip and a plastic mass. The semiconductor component is based on a panel-shaped composite body whose upper side forms a coplanar face including, in a coplanar arrangement, the active upper side of the semiconductor chip and a surface of the insulating plastic mass filled with conductive particles. In this semiconductor component according to the described device, through-contacts extend through the composite body from the upper side to the underside of the composite body. These through-contacts comprise conductive particles which have been sintered or fused together.

The through-contacts are at a safety distance from the active upper side of the semiconductor chip embedded in the plastic mass. This safety distance between through-contacts and the active upper side of the semiconductor chip is conditioned by the method and is larger than in the case of through-contacts which have been produced with photoresist technology and deposition technologies. The conductive particles comprise nanoparticles which can be composed of carbon or metals. Such nanoparticles have the advantage that on the one hand they are finely distributed in the volume of the plastic mass and on the other hand can condensate to form agglomerates and can thus form conductor tracks through the plastic mass in the form of through-contacts.

In addition to nanoparticles, particles such as are used in conductive adhesives, in the form of conductive silver and/or copper, are also possible in the plastic mass. The portion of conductive particles is approximately or about 80 to 98% by weight of the plastic mass, ensuring that, on the one hand, the plastic mass remains insulating and a through-contact is possible only where through-contacts have been produced using the described method. Apart from the through-contacts which virtually surround the semiconductor chip in the plastic mass, there are contact faces on the active upper side of the semiconductor chip which are connected to the through-contacts via rewiring lines. These rewiring lines can be applied after the through-contacting step, so that it is possible to access the contact face of the active upper side of the semiconductor chip both from the underside of the semiconductor chip and from the upper side of the semiconductor chip.

The described device also relates to a semiconductor module comprising a plurality of semiconductor chips in a plastic mass which form a panel-shaped composite body whose upper side forms a coplanar face made of active upper sides of the semiconductor chips and surfaces of the insulating plastic mass filled with conductive particles. In this context, the through-contacts extend through the plastic mass from the upper side of the composite body to the underside of the composite body. These through-contacts are composed of conductive particles, sintered or fused together, of the plastic mass.

The semiconductor module can comprise horizontally stacked semiconductor components which are electrically connected to one another via a rewiring layer on the coplanar face. For this purpose, the through-contacts include external contact faces at their penetration points through the composite body on the upper side and the underside of the composite body. As a result, extremely complex semiconductor modules can be easily formed. Furthermore, it is possible to provide vertically stacked semiconductor modules by stacking a plurality of composite bodies one on top of the other. In such a case, the through-contacts, arranged one on top of the other, of the stacked composite bodies are electrically connected to one another.

It is to be noted that with the described method, semiconductor components which are produced according to the "universal wafer level package concept" can be connected in a horizontally stacked fashion and/or in a vertically stacked fashion to form semiconductor modules. When producing such a "wafer level package", the plastic which is used is interspersed or filled with a high component of electrically conductive metallic nanoparticles or this plastic mass is correspondingly prepared and supplied in mixed form. Other electrically conductive particles can also be used for the described method. For example, soot particles or polymer particles with a metallic coating can be used to implement the corresponding through-contacts.

After the wafer level package has been molded, the nanoparticles are distributed randomly in the matrix such that there is no electrical connection present. Subsequently, a strong electromagnetic field is applied to the entire composite body of the wafer level package via the multipoint electrodes, thereby fusing or agglomerating or sintering the nanoparticles along the field lines. As a result, an electrically conductive through-contact is formed. Advantageously, corresponding rewiring layers for the connection of further packages can be applied both to the underside and to the upper side of the composite body.

In the following paragraphs, exemplary embodiments of the device and/or method are described in connection with the figures.

FIG. 1 shows a schematic cross section through a semiconductor module 15 according to a first embodiment of the described device. This semiconductor module 15 includes in this cross section three semiconductor chips 3 with active upper sides 7. These three semiconductor chips 3 are embedded with their side edges and their rear sides in a plastic mass 4. The active upper sides 7 of the semiconductor chips 3 form, together with the surface 8 of the plastic mass 4, a coplanar face 6 on the upper side 5 of a composite body 2 made of semiconductor chips 3 and plastic mass 4. The upper side 5 of the composite body 2 includes, on the coplanar face 6, a rewiring layer 26 which includes external contact faces 25 in the region of the plastic surfaces 8 and contact faces 21 in the region of the active upper sides 7 of the semiconductor chips 3.

Rewiring lines 22 are arranged between the external contact faces 25 on the upper side 5 of the panel-shaped composite body 2 in the rewiring layer 26, the rewiring lines 22 connecting the contact faces 21 of the semiconductor chips 3 to the external contact faces 25. These external contact faces 25 on the upper side 5 of the composite body 2 are connected to external contact faces 25 on the underside 12 of the composite body 2 via through-contacts 1. As a result there is access to the semiconductor chips 3 and their contact faces 21 both via the external contacts 25 on the upper side 5 and via the external contacts 25 on the underside 12 of the semiconductor module 15.

In this embodiment of the described device, the plastic mass 4 includes conductive nanoparticles 9. The nanoparticles 9 are a percent by weight of about between 80 and 98% with respect to the plastic mass 4 such that the plastic mass 4 is insulating. Once the conductive nanoparticles 9 have agglomerated, fused or sintered, through-contacts 1 form electric paths through the plastic mass 4. These particles can also be conductive soot particles or metal-coated polymer particles. Owing to their manufacturing method, the through-contacts 1 have frayed cross sections which do not form smooth pillar lateral surfaces. The profile within the plastic mass 4 is also not linear but rather is formed according to the most favorable current path when the through-contacts are produced. An advantage of this semiconductor module 15 is that it can be extended as desired via stacking the plurality of semiconductor modules 15 one on top of the other.

Figure 2:
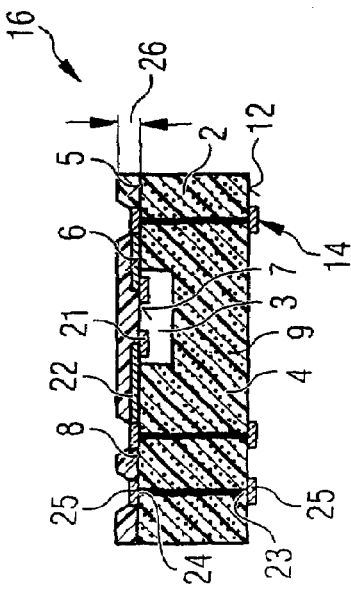
FIG. 2 is a schematic cross section through a semiconductor component according to a second embodiment of the described device.

FIG. 2 shows a schematic cross section through a semiconductor module 16 according to a second exemplary embodiment of the described device. Components with identical functions to those in FIG. 1 are characterized with identical reference symbols and not additionally explained. This semiconductor module 16 is composed of a composite body 2 with a plastic mass 4 and a semiconductor chip 3, through-contacts leading through the plastic mass 4 filled with metallic particles 9, from the underside 12 of the semiconductor component 16 to the upper side 5 of the semiconductor component 16 at the positions 14 of the through-contacts. The external contact faces 25 of the semiconductor module 16 which are shown here may comprise solder balls both on the upper side 5 and on the underside 12 of the composite body 2 or may comprise planar external contacts.

FIGS. 3 to 6 show schematic cross sections through intermediate products of the described method during the production of a composite panel 2 with through-contacts 1 according to a third embodiment of the described device.

Figure 3:
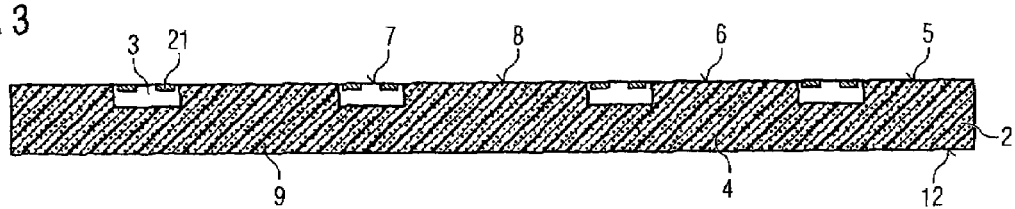

In this respect, FIG. 3 shows a schematic cross section through a composite panel 2 without through-contacts 1. The composite panel 2 is in practice first provided for the method according to the described device in which such a panel-shaped composite body 2 is produced, the composite body 2 including on its upper side 5 a face 6 which is coplanar with active upper sides 7 of semiconductor chips 3 and with surfaces 8 of an insulating plastic mass 4 filled with conductive particles 9.

Figure 4:
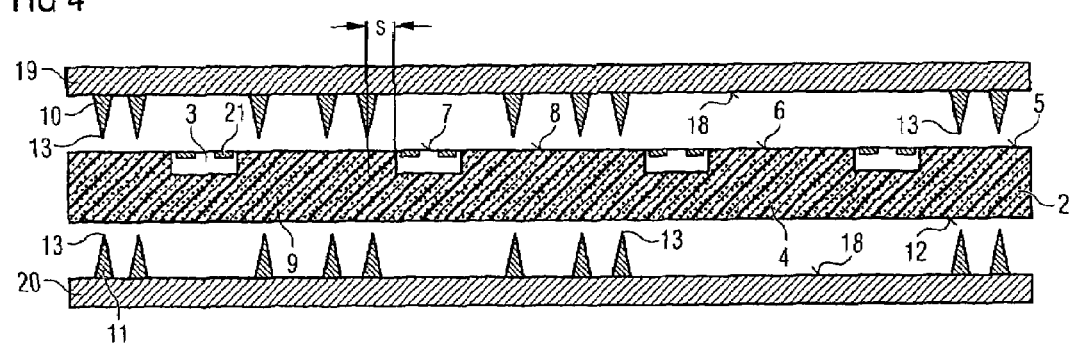

FIG. 4 shows a schematic cross section through the composite panel 2 according to FIG. 3 with fitted-on multipoint electrodes 19 and 20. The multipoint electrodes 19 and 20 have an electrode surface 18 which corresponds in its size to the size of the composite body 2. Point electrodes 10 and 11 which comprise electrode points 13 are disposed on the electrode surfaces 18, the lower point electrodes 11 being oriented with respect to the upper point electrodes 10 such that they assume positions of through-contacts 1 to be formed on the upper side 5 and underside 12 of the composite body 2. In this context, a safety distance s is maintained between the side edges of the semiconductor chips 3 and the electrode points 13, in order to prevent through-contacts from being formed between the electrode points 13 through the semiconductor chips 3.

FIG. 5 shows a schematic cross section through the composite panel 2 according to FIG. 4 after fabricating the through-contacts 1. A high voltage of 1 to 10 kV is applied to the point electrodes 10 and 11 shown in FIG. 4 such that an electric path is formed between the points 13 of the point electrodes 10 and 11 which lie opposite one another in FIG. 4, and thereby, brings about electrical connection of the conductive particles 9 of the filled plastic mass 4. In this context, the particles 9 can be sintered or fused to one another.

FIG. 6 shows the composite panel 2 according to FIG. 5 subsequent to the application of external contact faces 25 and a rewiring layer 26. The external contact faces 25 are arranged at the penetration points 23 and 24 of the through-contacts 1 through the composite panel 2. The external contact faces 25 can be formed by depositing corresponding metal layers. At the same time as external contact faces 25 are deposited on the upper side 5 of the composite body 2 it is possible to generate rewiring lines 22 in the rewiring layer 26. These rewiring lines 22 connect the external contact faces 25 on the surfaces 8 of the plastic mass 4 to contact faces 21 of the semiconductor chips 3.

Figure 7:
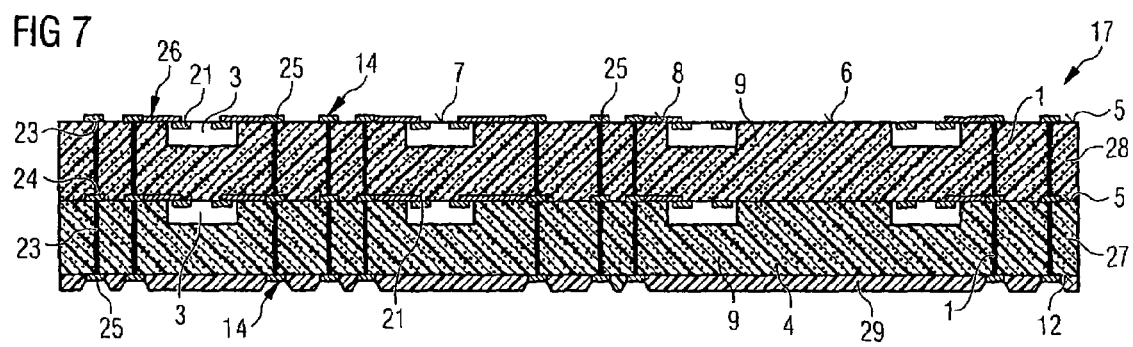
FIG. 7 is a schematic cross section through a semiconductor stack according to a fourth embodiment of the described device.

FIG. 7 is a schematic cross section through a semiconductor stack 17 according to a fourth embodiment of the described device. In this case, the semiconductor module 28 which was shown in FIG. 6 has been applied vertically to an identical semiconductor module 27 of the same design with identical through-contacts 1. External contact faces 25 are arranged on the underside of this semiconductor stack 17 and a solder stop resist layer 29 can be applied between the external contact faces 25 in order to prevent the solder from spreading out when the semiconductor stack 17 is soldered onto a printed circuit board arranged above it. A similar solder stop resist layer can also be arranged on the upper side of the semiconductor stack 17 in conjunction with the rewiring layer 26. Likewise, a rewiring layer 26 is arranged between the two stacked semiconductor modules 27 and 28 in order to connect electrically the semiconductor chips 3 of the lower semiconductor module 27 to the through-contacts 1. It is thus possible to access all those contact faces 21 of the semiconductor chips 3 which are arranged in the semiconductor stack 17 both from the upper side 5 and from the underside 12.

While the device and method have been described in detail with reference to specific embodiments thereof, it will be apparent to one of ordinary skill in the art that various changes and modifications can be made therein without departing from the spirit and scope thereof. Accordingly, it is intended that the described device and method cover the modifications and variations of this device and method provided they come within the scope of the appended claims and their equivalents.

What is claimed is:

1. A method for producing through-contacts through a panel-shaped composite body including at least one semiconductor chip and a plastic mass, the method comprising:
producing the panel-shaped composite body including, on an upper side, a coplanar face with an active upper side of the at least one semiconductor chip and surfaces of an insulating plastic mass comprising conductive particles;
introducing the panel-shaped composite body between at least two high-voltage point electrodes;
orienting the at least two high-voltage point electrodes on the surface and on an underside of the panel-shaped composite body such that tips of corresponding ones of the at least two high-voltage point electrodes are disposed opposite one another at positions for through-contacts to be manufactured through the plastic mass;
applying a high voltage to the oriented at least two high-voltage point electrodes;
switching off the high voltage; and
removing the through-contacted, panel-shaped composite body from between the at least two high-voltage point electrodes.

2. The method as claimed in claim 1, wherein the at least two high-voltage point electrodes are positioned at a safety distance from the active upper side of the at least one semiconductor chip embedded in the plastic mass.

3. The method as claimed in claim 1, wherein the at least two high-voltage point electrodes are arranged on electrode surfaces of two multiple point electrodes corresponding to the size of the panel-shaped composite body.

4. The method as claimed in claim 1, wherein the high voltage is between 1 and 100 kV.

5. The method as claimed in claim 1, further comprising:
applying high voltage pulse sequences to the at least two high-voltage point electrodes.

6. The method as claimed in claim 1, wherein a portion of conductive particles is about 80 to 98% by weight of the insulating plastic mass.

7. The method as claimed in claim 6, wherein the conductive particles are metallic nanoparticles.

8. The method as claimed in claim 6, wherein the conductive particles are at least one of: silver and copper.

9. The method as claimed in claim 1, wherein the plastic mass is premixed with the conductive particles and a reducing medium.

* * * * *